United States Patent [19]

Fujita

[11] Patent Number: 4,543,593
[45] Date of Patent: Sep. 24, 1985

[54] SEMICONDUCTOR PROTECTIVE DEVICE
[75] Inventor: Katsuji Fujita, Yokohama, Japan
[73] Assignee: Tokyo Shibaura Denki Kabushiki Kaisha, Kawasaki, Japan
[21] Appl. No.: 531,619
[22] Filed: Sep. 13, 1983
[30] Foreign Application Priority Data Sep. 14, 1982 [JP] Japan ................... 57-159956

[51] Int. Cl.$^4$ ............................ H01L 27/04
[52] U.S. Cl. ........................ 357/48; 357/38; 357/23.13; 361/91
[58] Field of Search .............. 357/38, 48, 23.13; 361/56, 57, 91; 307/542, 549, 557, 567

[56] References Cited
U.S. PATENT DOCUMENTS 4,400,711 8/1983 Avery .................... 357/38
4,463,369 7/1984 Harford .................. 357/48

FOREIGN PATENT DOCUMENTS 0128858 10/1980 Japan .................... 357/48
0140263 11/1980 Japan .................... 357/48

Primary Examiner—William D. Larkins
Assistant Examiner—E. Fallick
Attorney, Agent, or Firm—Finnegan, Henderson, Farabow, Garrett & Dunner

[57] ABSTRACT

A semiconductor protective device has a semiconductor substrate of one conductivity type, the first island region being of a conductivity type opposite to that of the semiconductor substrate; second and third regions formed in a surface layer of the first region and being of the same conductivity type as that of the semiconductor substrate; a first transistor emitter region formed in the surface region of the second region and being of a conductivity type opposite to that of the semiconductor substrate; a low-resistance region formed across the second region and the third region; a first electrode formed on the first transistor emitter region; a second electrode; a third electrode connected to the second electrode by the low-resistance region; a first wiring layer connecting the first electrode and the third electrode and connected to an external terminal, the resistance of the semiconductor region between the first electrode and the first transistor emitter region being lower than that of the semiconductor region between the first electrode and the third electrode; and a second wiring layer connected between an internal circuit and the second electrode. By a combination of resistors and bipolar transistors, the semiconductor protective device can absorb both positive and negative external surge inputs, thereby protecting the internal circuit.

19 Claims, 11 Drawing Figures

4,543,593

SEMICONDUCTOR PROTECTIVE DEVICE

BACKGROUND OF THE INVENTION

The present invention relates to a semiconductor device and, more particularly, to a semiconductor protective device formed between an external terminal and an internal circuit to protect the internal circuit from an external surge input.

Input protective diodes, etc., are known as semiconductor protective devices for MOS semiconductor devices such as MOSFETs. However, with semiconductor ICs having bipolar transistors, no semiconductor protective device formed in the IC has been proposed wherein internal elements (internal circuit) are protected against both positive and negative external surge inputs. Therefore, a protective device for a semiconductor device, such as a bipolar IC having a bipolar transistor configuration, is required.

SUMMARY OF THE INVENTION

The present invention has been made in consideration of the above situation, and has for its object to provide a semiconductor protective device for a semiconductor device having a bipolar transistor configuration. The protective device can be formed in the bipolar IC to occupy a small area, and is capable of effectively protecting the internal elements from both positive and negative external surge inputs.

According to the semiconductor protective device of the present invention, second and third regions of one conductivity type are formed in a surface layer of a first region formed on a semiconductor substrate of the one conductivity type and of a conductivity type opposite to that of the semiconductor substrate. A first transistor emitter region of the conductivity type opposite to that of the semiconductor substrate is formed in the second region, and a low-resistance region is formed across the second and third regions. A first electrode is formed on the first transistor emitter region, a second electrode is formed connecting the second region with the low-resistance region, and a third electrode is formed connecting the third region with the low-resistance region.

The resistance of the semiconductor region between the first transistor emitter region and the second electrode is much lower than that of the semiconductor region between the first transistor emitter region and the third electrode. The first and third electrodes are connected to one external terminal through a first wiring. The second electrode is connected through a second wiring to an internal circuit which is to be protected against an external surge input.

The second and third regions can alternatively be constituted by a single region.

When a negative surge current exceeding the rated value is about to flow into the internal circuit, the surge current is absorbed by a first transistor and a second transistor. The first transistor comprises the first region, the second region, and the first transistor emitter region. The second transistor comprises the semiconductor substrate, the first region and the second region. On the other hand, when a positive surge current is about to flow into the internal circuit, the surge current can be absorbed by a third transistor. The third transistor comprises the third region, the first region and the semiconductor substrate. The surge input to the internal circuit is reduced by a resistance of the low-resistance region. Therefore, the internal circuit can be protected against both positive and negative surge inputs.

DETAILED DESCRIPTION OF THE PREFERRED EMBODIMENTS

A semiconductor protective device according to a first embodiment of the present invention will be described with reference to the accompanying drawings.

Figure 1A:
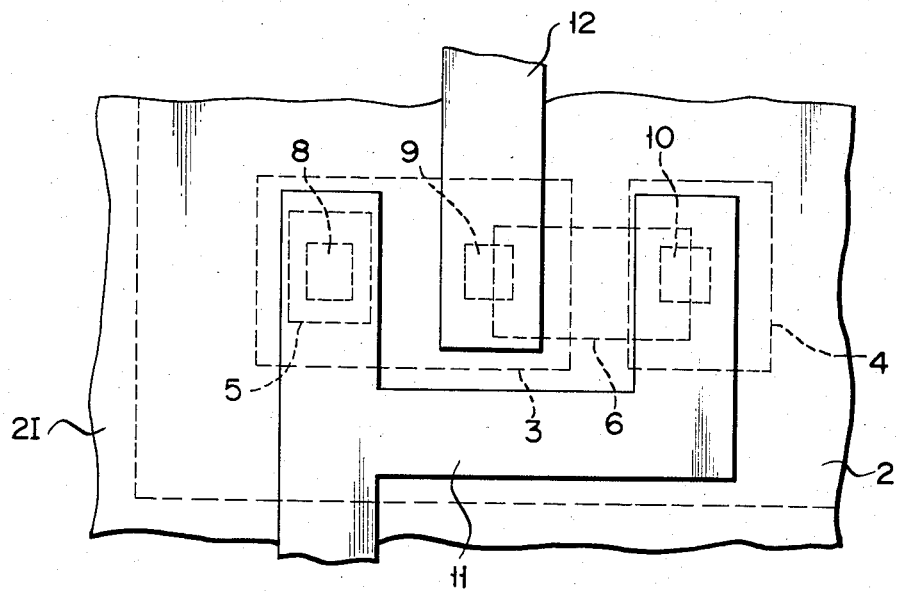
FIGS. 1A and 1B are respectively a plan view and a sectional view of a semiconductor protective device according to a first embodiment of the present invention.
Figure 1B:
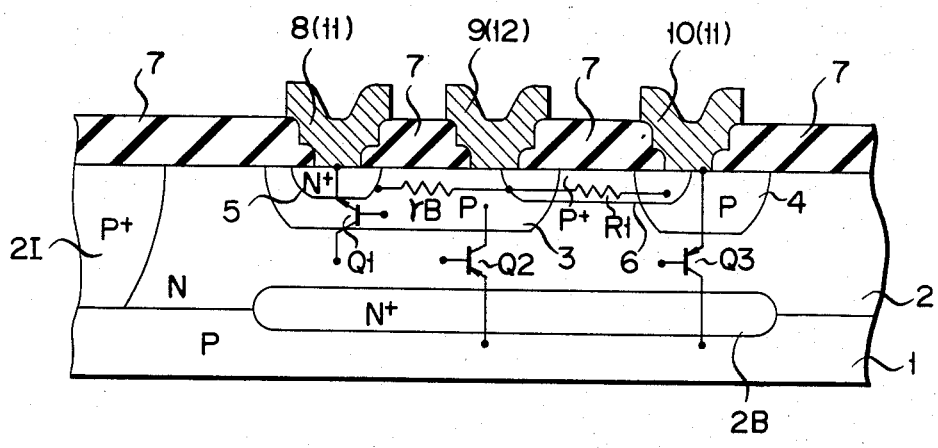

Referring to FIGS. 1A and 1B, an $n^+$-type buried layer 2B is formed in a p-type semiconductor substrate 1. An n-type epitaxial layer is grown on the semiconductor substrate 1. A $p^+$-type isolation region 2I is formed in the epitaxial layer to obtain an n-type island region 2 surrounded by the isolation region 2I. Thereafter, a first p-type region 3 and a second p-type region 4 are separately formed in a surface layer of the n-type island region 2. An $n^+$-type first transistor emitter region 5 is formed by selective doping of an n-type impurity in the first p-type region 3. Meanwhile, a $p^+$-type low-resistance region 6 having an impurity concentration higher than those of the first and second p-type regions 3 and 4 is formed to connect the first and second p-type regions 3 and 4. Contact holes are formed at predetermined positions in an insulating film 7 formed on the wafer. A metal film essentially consisting of, for example, aluminum is deposited to cover the entire surface including the contact holes. The metal film is then patterned. As a result, there are provided a first electrode 8 connected to the first transistor emitter region 5, a second electrode 9 formed across the boundary of the first p-type region 3 and the low-resistance region 6 so as to connect them, and a third electrode 10 formed across the boundary of the second p-type region 4 and the low-resistance region 6 so as to connect them. The first electrode 8 is electrically connected to the third electrode 10 through a first metal wiring layer 11. The first wiring layer 11 connected between the first and third electrodes 8 and 10 extends to an external terminal (not shown). A second wiring layer 12 connected to the second electrode 9 is connected to an internal circuit (not shown) of the semiconductor device.

The device shown in FIG. 1B has a first transistor Q1 of npn type having the n-type island region 2 as its collector, the first p-type region 3 as its base and the first transistor emitter region 5 as its emitter; a second transistor Q2 of pnp type having the p-type semiconductor substrate 1 as its emitter, the n-type island region 2 as its base and the p-type region 3 as its collector; and a third transistor Q3 of pnp type having the second p-type region 4 as its emitter, the n-type island region 2 as its base and the p-type semiconductor substrate 1 as its collector. A low resistor R1 constituted of the low-resistance region 6 is inserted between the second and third electrodes 9 and 10.

Figure 2:
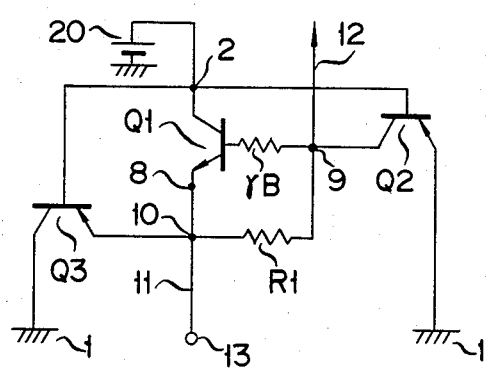
FIG. 2 is a circuit diagram of an equivalent circuit of the device shown in FIGS. 1A and 1B.

FIG. 2 shows an equivalent circuit of the device shown in FIGS. 1A and 1B. When the device is operated, the semiconductor substrate 1 is set at ground potential. The n-type island region 2 is connected to a positive bias power supply 20 having a low impedance. The bases of the second and third transistors Q2 and Q3 and the collector of the first transistor Q1 are commonly connected to the n-type island region 2. A resistance $r_B$ (FIG. 1B) of the first p-type region 3 from the second electrode 9 to the first transistor emitter region 5 corresponds to a base resistance $r_B$ of the first transistor Q1.

When the device is energized, the second and third transistors Q2 and Q3, the bases of which receive the voltage from the bias power supply 20, are turned OFF. A signal in the normal current range is supplied, for example, from the internal circuit to an external terminal 13 through the resistor R1. Since the resistance of the resistor R1 is very low, a sufficient potential difference to turn on the first transistor Q1 will not occur between the base and emitter thereof even if the signal in the normal current range flows through the resistor R1. Therefore, the normal signal can be applied from the internal circuit to the external terminal 13 without difficulty.

Figure 3:
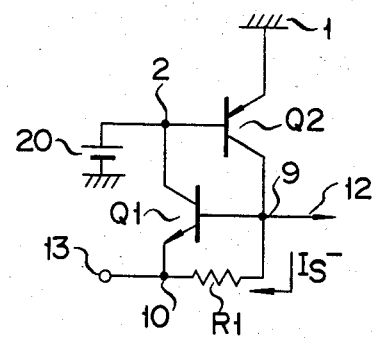
FIG. 3 is a circuit diagram for explaining the operation when a negative external surge input is supplied to the circuit shown in FIG. 2.

Assume that a negative surge voltage is applied from the external terminal 13 to the internal circuit. In this case, the transistor Q3 is rendered nonconductive. An equivalent circuit of the semiconductor protective circuit with the protective device powered is illustrated in FIG. 3. The internal circuit is protected by a circuit portion having the first and second transistors Q1 and Q2 and the resistor R1 which has a low resistance. More particularly, when a current $I_{S-}$ exceeding $V_{BE}(Q1)/R1$ (where $V_{BE}(Q1)$ is the base-emitter voltage of the transistor Q1) flows in the internal circuit, the transistors Q1 and Q2 are both turned on to absorb the surge current which is about to flow in the internal circuit. The resistance $r_B$ is omitted in FIG. 3.

However, when the device is not energized (e.g., the device is being transported), the bias power supply 20 in FIG. 3 is removed. In this case, the base of the second transistor Q2 is regarded as being grounded through a very small impedance. The internal circuit is protected by a thyristor comprising the first and second transistors Q1 and Q2.

Figure 4:
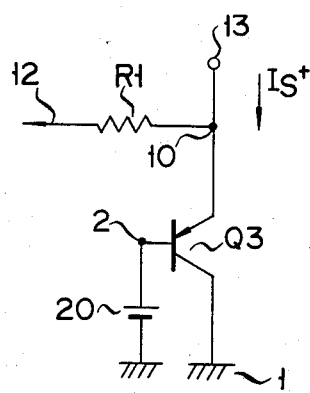
FIG. 4 is a circuit diagram for explaining the operation when a positive external surge input is supplied to the circuit shown in FIG. 2.

When a positive surge voltage is applied from the external terminal 13 to the internal circuit, the first and second transistors Q1 and Q2 are rendered nonconductive. A current path shown in FIG. 4 is formed in the semiconductor protective device. A surge input current $I_{S+}$ externally supplied is absorbed by the third transistor Q3, and the surge voltage component which is about to be applied to the internal circuit is limited by the resistor R1. As a result, the internal circuit can be properly protected.

However, when the semiconductor protective device is not energized, the base of the third transistor Q3 is regarded as being grounded through a very small resistor, not through the bias power supply 20 shown in FIG. 4. The external surge input current $I_{S+}$ is absorbed by the third transistor Q3, and the surge current which is about to flow into the internal circuit is limited by the resistor R1.

The external terminal 13 may be a signal input terminal or a signal output terminal of a semiconductor device such as an IC.

Figure 5:
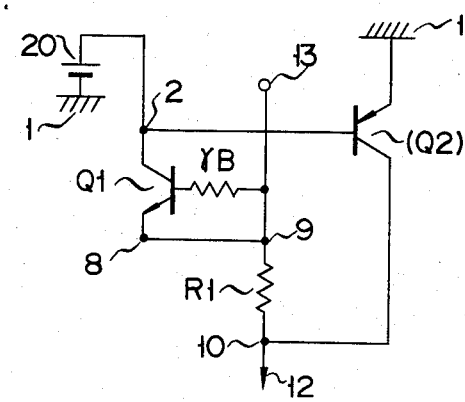
FIG. 5 is a circuit diagram of an equivalent circuit of the device shown in FIG. 1 when wiring is changed.

The structure immediately under the second electrode 9 is the same as that under the third electrode 10, as shown in FIG. 1B. It can be considered that the pnp transistor Q3 having the p-type semiconductor substrate 1 as its collector is formed immediately under the second electrode 9. It can also be considered that the pnp transistor Q2 having the p-type semiconductor substrate 1 as its emitter is formed immediately under the third electrode 10. Based on the above assumptions, it is proposed to connect the first electrode 8 to the second electrode 9, to connect the external terminal to the junction thereof, and to connect a wiring layer connected to the internal circuit to the third electrode 10. However, when such a wiring modification is performed, the equivalent circuit of FIG. 2 is modified to that shown in FIG. 5. A potential difference caused by a voltage drop across the resistor R1 upon reception of a negative surge input from the external terminal 13 to the semiconductor protective circuit cannot be applied to the base-emitter path of the transistor Q1. As a result, effective surge input absorption cannot be performed. The transistor Q3 is omitted in FIG. 5.

Referring again to FIG. 1B, let $r_B$ denote the resistance of the semiconductor region between the first transistor emitter region 5 and the second electrode 9. The resistance of the semiconductor region between the first transistor emitter region 5 and the third electrode 10 will then be given as $r_B + R1$. The second wiring layer 12 is connected to the internal circuit through the electrode 9 having a resistance lower than that of the electrode 10 with respect to the first transistor emitter region 5. The electrode 10 is connected to the emitter electrode 8 of the first transistor Q1 through the first wiring layer 11, and a wire is connected between this junction and the external terminal 13.

As is apparent from the description made with respect to the first embodiment, the resistor R1 serves to generate a base-emitter voltage of the transistor Q1 against the negative surge input. The resistor R1 serves as a current-limiting resistor for a positive surge voltage. The normal output signal is supplied from the internal circuit to the external terminal 13 through the resistor R1. For this reason, the resistor R1 must have a sufficiently small resistance so as not to turn on the transistor Q1.

If the low-resistance region 6 shown in FIG. 1B has the same conductivity as that of the n-type island region 2, the resistor R1 in FIG. 2 is connected to the collector of the transistor Q1. Therefore, the device cannot correctly operate when a negative surge input is applied. To make the device operate correctly, the low-resistance region 6 must be electrically isolated from the n-type island region 2 by, for example, a p-n junction as shown in FIG. 1B.

Figure 6A:
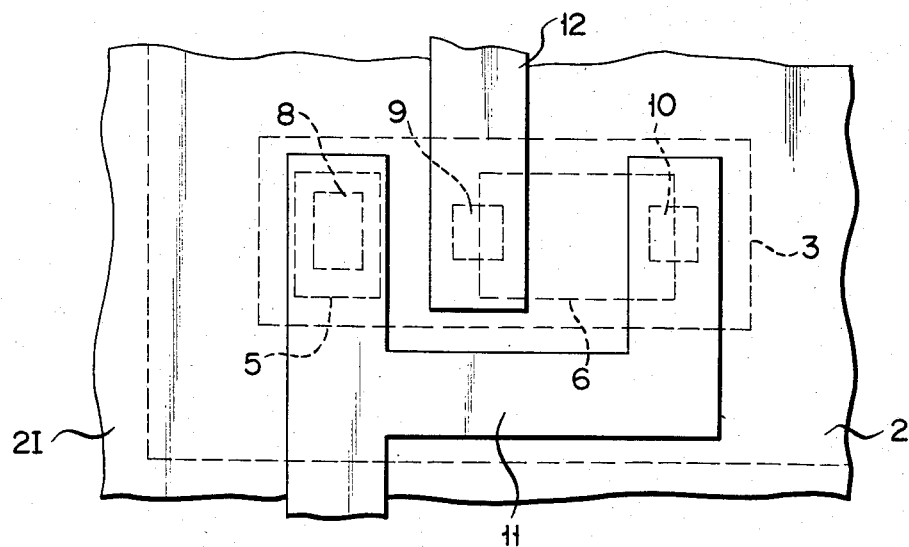
FIGS. 6A and 6B are respectively a plan view and a sectional view of a semiconductor protective device according to a second embodiment of the present invention.
Figure 6B:
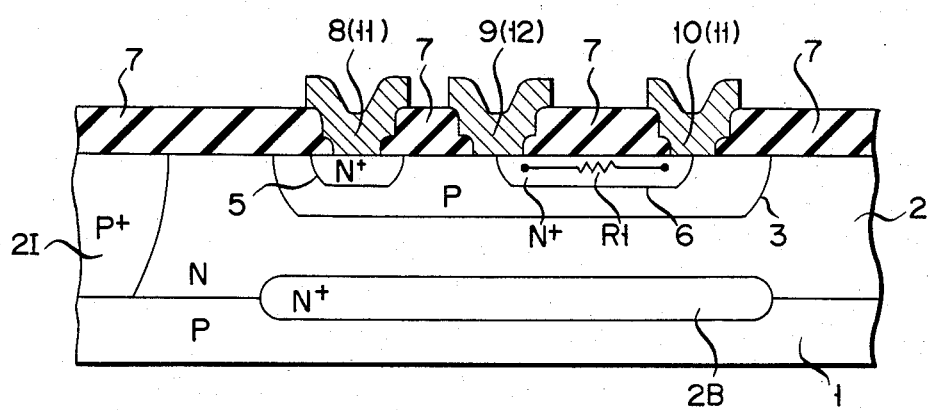

Provided the circuit configuration satisfies the above conditions, the device shown in FIGS. 6A and 6B can be used.

In particular, a p-type region 3 can be formed in an n-type island region 2, and an n-type first transistor emitter region 5 and an n+-type low-resistance region 6 can be formed in the p-type region 3. In this case, the first p-type region 3 and the second p-type region 4 of the first embodiment are constituted by the single (integral) p-type region 3. A pnp transistor Q2 is formed vertically in a semiconductor substrate 1 when viewed from a second electrode 9. A pnp transistor Q3 is formed vertically in the semiconductor substrate when viewed from a third electrode 10. A low resistor R1 comprising an n+-type region is formed between the second electrode 9 and the third electrode 10. The resistance R1 is parallel with the resistance of the p-type region 3 between the first and second electrodes 8 and 9. Since the resistance of the p-type region 3 is high, the resistance R1 roughly corresponds to the resistance of the low-resistance region 6. Furthermore, since the diffusion depth of the low-resistance region 6 is shallower than that of the p-type region 3, the n-type island region 2 as the collector of the transistor Q1 is electrically isolated from the low-resistance region 6 through the p-type region 3.

The semiconductor protective device shown in FIGS. 6A and 6B has a typical npn transistor configuration having the p-type region 3 as the base. Therefore, the semiconductor protective device of the present invention can be easily manufactured in accordance with a conventional process for manufacturing bipolar transistors.

The structure of regions excluding the p-type region 3 and the operation of the semiconductor protective device of this embodiment are the same as those in the first embodiment. The same reference numerals as used in FIGS. 1A and 1B denote the same parts in FIGS. 6A and 6B, and a detailed description thereof is omitted.

Figure 7:
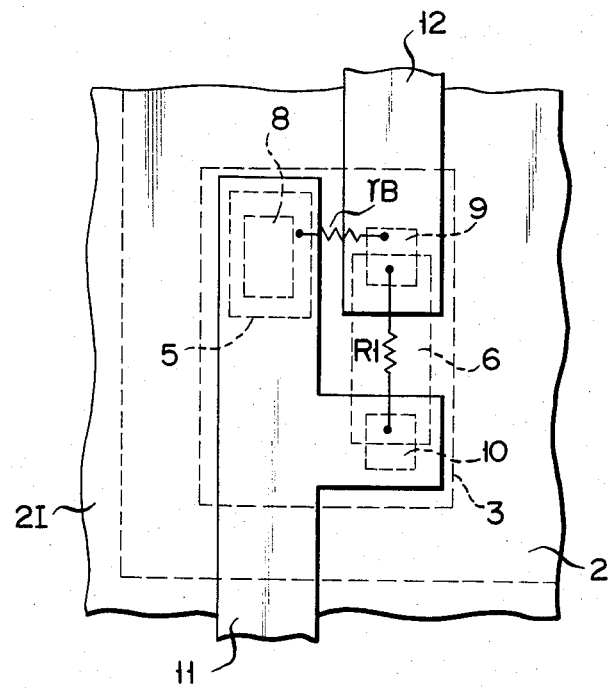
FIG. 7 is a plan view of a semiconductor protective device according to a third embodiment of the present invention.

FIG. 7 is a plan view showing a semiconductor protective device according to a third embodiment of the present invention. A second electrode 9, having a resistance lower than that of a third electrode 10 (among second and third electrodes 9 and 10 which are connected to a low-resistance region 6) with respect to a first transistor emitter region 5, is connected to the internal circuit. The electrode 10 having a higher resistance with respect to the first transistor emitter region 5 is connected through a wiring layer 11 to an electrode 8 formed on the first transistor emitter region 5. The wiring layer 11 is connected to an external terminal. However, the configuration of the first to third electrodes 8, 9 and 10 and the wiring layer pattern are not limited to those in FIG. 6A, but can be modified, if necessary, as shown in FIG. 7.

Figure 8:
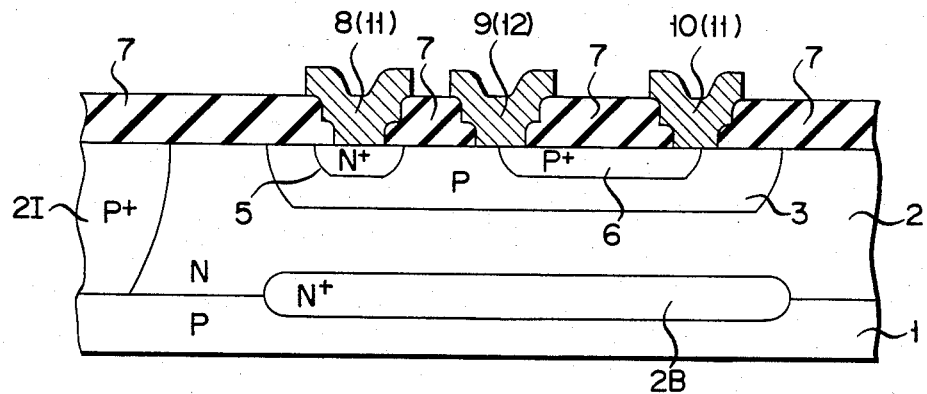
FIG. 8 is a sectional view of a semiconductor protective device according to a fourth embodiment of the present invention.

FIG. 8 is a sectional view of a semiconductor protective device according to a fourth embodiment of the present invention. The device of this embodiment is substantially the same as that of the second embodiment, except that a low-resistance region 6 is formed by a p+-type region in place of the n+-type region.

Figure 9:
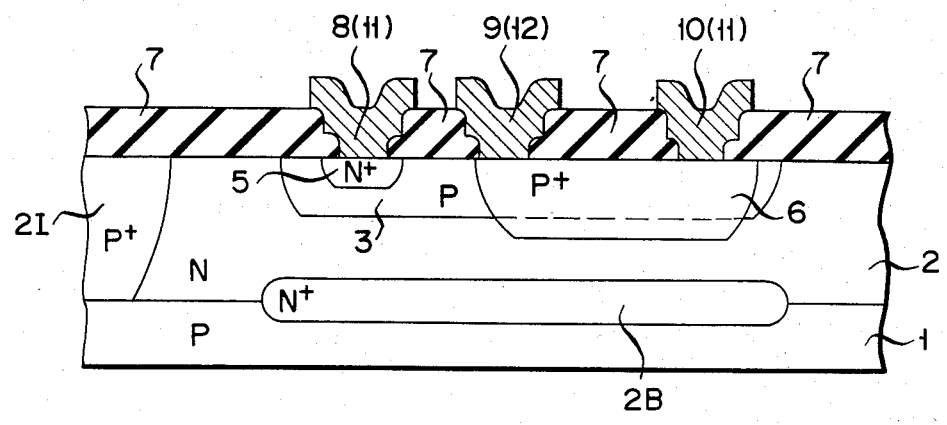
FIG. 9 is a sectional view of a semiconductor protective device according to a fifth embodiment of the present invention.

In the fifth embodiment shown in FIG. 9, a low-resistance region 6 is formed by a p+-type region having a junction depth greater than that of a p-type region 3 with the low-resistance region 6 comprising a region of a conductivity type opposite to that of the n-type region 2.

When the p-type region 3 is of the same conductivity type as that of the low-resistance region 6, as shown in FIG. 9, the electrodes 9 and 10 need not be formed in the contact holes formed overlapping the p-type region 3 and the low-resistance region 6, since the p-type region 3 is electrically connected to the electrodes 9 and 10 through the low-resistance region 6.

The present invention is not limited to the embodiments described above. Various changes and modifications may be made within the spirit and scope of the present invention. For example, the conductivity types of the substrate, regions and the biasing direction of the voltage may be reversed.

What is claimed is:

1. A semiconductor protective device comprising:
   a semiconductor substrate of one conductivity type;
   a first region formed on said semiconductor substrate and being of a conductivity type opposite to that of said semiconductor substrate;
   second and third regions formed in a surface layer of said first region and being of the same conductivity type as that of said semiconductor substrate;
   a first transistor emitter region formed in said second region and being of a conductivity type opposite to that of said semiconductor substrate;
   a low-resistance region formed across said second region and said third region, having an impurity concentration higher than that of said second and third regions and being of the conductivity type opposite to that of said first region;
   a first electrode formed on said first transistor emitter region;
   a second electrode connected to that portion of said low-resistance region which is adjacent to said second region;
   a third electrode connected to that portion of said low-resistance region which is adjacent to said third region;
   a first wiring layer connecting said first electrode and said third electrode and connected to an external terminal; and
   a second wiring layer connecting a circuit formed on said semiconductor substrate and said second electrode.

2. A device according to claim 1, wherein said semiconductor substrate is of p conductivity type, said first region is of n conductivity type, said second and third regions are of p conductivity type, said first transistor emitter region is of n+ conductivity type, and said low-resistance region is of p+ conductivity type.

3. A device according to claim 1, wherein said semiconductor substrate is of n conductivity type, said first region is of p conductivity type, said second and third regions are of n conductivity type, said first transistor emitter region is of p+ conductivity type, and said low-resistance region is of n+ conductivity type.

4. A device according to claim 2, wherein said first region is set at a positive potential with respect to said semiconductor substrate.

5. A device according to claim 3, wherein said first region is set at a negative potential with respect to said semiconductor substrate.

6. A semiconductor protective device comprising:
   a semiconductor substrate of one conductivity type;

a first region formed on said semiconductor substrate and being of a conductivity type opposite to that of said semiconductor substrate;

a second region formed in a surface layer of said first region and being of the same conductivity type as that of said semiconductor substrate;

a first transistor emitter region formed in said second region and being of a conductivity type opposite to that of said semiconductor substrate;

a low-resistance region formed in said second region, having an impurity concentration higher than that of said second region, and having an impurity depth smaller than that of said second region;

a first electrode formed on said first transistor emitter region;

a second electrode;

a third electrode connected to the second electrode by said low-resistance region;

a first wiring layer connecting said first electrode and said third electrode and connected to an external terminal; and a second wiring layer connecting a circuit formed on said semiconductor substrate and said second electrode.

7. A device according to claim 6, wherein said semiconductor substrate is of p conductivity type, said first region is of n conductivity type, said second region is of p conductivity type, said first transistor emitter region is of n+ conductivity type, said low-resistance region is of n+ conductivity type, and said second electrode and said third electrode are each formed partly on said second region and partly on said low-resistance region.

8. A device according to claim 6, wherein said semiconductor substrate is of p conductivity type, said first region is of n conductivity type, said second region is of p conductivity type, said first transistor emitter region is of n+ conductivity type, said low-resistance region is of p+ conductivity type.

9. A device according to claim 7, wherein said first region is set at a positive potential with respect to said semiconductor substrate.

10. A device according to claim 8, wherein said first region is set at a positive potential with respect to said semiconductor substrate.

11. A device according to claim 6, wherein said semiconductor substrate is of n conductivity type, said first region is of p conductivity type, said second region is of n conductivity type, said first transistor emitter region is of p+ conductivity type, and said low-resistance region is of p+ conductivity type, and said second electrode and said third electrode are each formed partly on said second region and partly on said low-resistance region.

12. A device according to claim 6, wherein said semiconductor substrate is of n conductivity type, said first region is of p conductivity type, said second region is of n conductivity type, said first transistor emitter region is of p+ conductivity type, and said low-resistance region is of n+ conductivity type.

13. A device according to claim 11, wherein said first region is set at a negative potential with respect to said semiconductor substrate.

14. A device according to claim 12, wherein said first region is set at a negative potential with respect to said semiconductor substrate.

15. A semiconductor protective device comprising:

a semiconductor substrate of one conductivity type;

a first region formed on said semiconductor substrate and being of a conductivity type opposite to that of said semiconductor substrate;

a second region formed in a surface layer of said first region and being of the same conductivity type as that of said semiconductor substrate;

a first transistor emitter region formed in said second region and being of a conductivity type opposite to that of said semiconductor substrate;

a low-resistance region formed in said second region, having an impurity concentration higher than that of said second region, having an impurity depth greater than that of said second region, and being of a conductivity type opposite to that of said first region;

a first electrode formed on said first transistor emitter region;

a second electrode;

a third electrode connected to the second electrode by said low-resistance region;

a first wiring layer connecting said first electrode and said third electrode and connected to an external terminal; and a second wiring layer connecting a circuit formed on said semiconductor substrate and said second electrode.

16. A device according to claim 15, wherein said semiconductor substrate is of p conductivity type, said first region is of n conductivity type, said second region is of p conductivity type, said first transistor emitter region is of n+ conductivity type, and said low-resistance region is of p+ conductivity type.

17. A device according to claim 15, wherein said semiconductor substrate is of n conductivity type, said first region is of p conductivity type, said second region is of n conductivity type, said first transistor emitter region is of p+ conductivity type, and said low-resistance region is of n+ conductivity type.

18. A device according to claim 16, wherein said first region is set at a positive potential with respect to said semiconductor substrate.

19. A device according to claim 17, wherein said first region is set at a negative potential with respect to said semiconductor substrate.

* * * * *